United States Patent
Ho et al.

(10) Patent No.: US 11,251,753 B2
(45) Date of Patent: Feb. 15, 2022

(54) ENVELOPE TRACKING SUPPLY MODULATOR WITH ZERO PEAKING AND ASSOCIATED ENVELOPE TRACKING CALIBRATION METHOD AND SYSTEM

(71) Applicant: MEDIATEK INC., Hsin-Chu (TW)

(72) Inventors: Chen-Yen Ho, Hsinchu (TW);
Yen-Liang Chen, Hsinchu (TW);
Chien-Wei Kuan, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/853,774

(22) Filed: Apr. 21, 2020

(65) Prior Publication Data

US 2020/0366247 A1 Nov. 19, 2020

Related U.S. Application Data

(60) Provisional application No. 62/846,802, filed on May 13, 2019.

(51) Int. Cl.
*H03F 1/02* (2006.01)
*H04B 1/40* (2015.01)
*H03F 3/24* (2006.01)
*H03G 3/30* (2006.01)

(52) U.S. Cl.
CPC ........... *H03F 1/0233* (2013.01); *H03F 3/245* (2013.01); *H03G 3/3042* (2013.01); *H04B 1/40* (2013.01); *H03F 2200/102* (2013.01); *H03F 2200/451* (2013.01); *H03G 2201/103* (2013.01); *H03G 2201/307* (2013.01)

(58) Field of Classification Search
CPC .. H03F 1/0233; H03F 3/245; H03F 2200/102; H03F 2200/451; H03G 3/3042; H03G 2201/103; H03G 2201/307; H04B 1/40
USPC ........................................................ 375/219
See application file for complete search history.

(56) References Cited

U.S. PATENT DOCUMENTS

| 5,973,556 A | 10/1999 | Su |
| 8,873,677 B1 | 10/2014 | Loh |
| 2009/0134913 A1* | 5/2009 | Hsiung ............ G01R 19/16557 327/58 |

(Continued)

FOREIGN PATENT DOCUMENTS

| CN | 105850050 B | 6/2018 |
| EP | 3 032 737 A1 | 6/2016 |

OTHER PUBLICATIONS

Michael Perrott (High Speed Communication Circuits and Systems Lecture 6 Enhancement Techniques for Broadband Amplifiers, Narrowband Amplifiers, MIT, 2003) (Year: 2003).*

(Continued)

*Primary Examiner* — Ted M Wang
(74) *Attorney, Agent, or Firm* — Wolf, Greenfield & Sacks, P.C.

(57) ABSTRACT

An envelope tracking supply modulator includes an amplifier circuit and a zero peaking circuit. The amplifier circuit receives an envelope input, generates a modulated supply voltage according to the envelope input, and provides the modulated supply voltage to a power amplifier. The zero peaking circuit is coupled to the amplifier circuit, and applies zero peaking to the amplifier circuit, where the zero peaking inserts a zero at a frequency.

14 Claims, 4 Drawing Sheets

(56) References Cited

U.S. PATENT DOCUMENTS

| | | | |
|---|---|---|---|
| 2013/0231069 A1* | 9/2013 | Drogi | H03F 3/211 455/114.3 |
| 2014/0097893 A1* | 4/2014 | Ajima | H03F 3/245 330/136 |
| 2014/0328433 A1 | 11/2014 | Loh | |
| 2015/0236654 A1 | 8/2015 | Jiang | |
| 2016/0249300 A1* | 8/2016 | Tsai | H04B 17/13 |
| 2017/0019133 A1 | 1/2017 | Gwon | |

OTHER PUBLICATIONS

Paek, "An 88%-Efficiency Supply Modulator Achieving 1.08μs/V Fast Transition and 100MHz Envelope-Tracking Bandwidth for 5G New Radio RF Power Amplifier", ISSCC 2019/ Session 15/ Power for 5G, Wireless Power, and GAN Converters / 15.1, pp. 238-239 and a page including Figure 15.1.7.

Yifan Zhang et al., A Buck Converter Using a Fully-Integrated Current-Mode Dual-Path Type-III Compensator for NB-IoT Applications, 2018 IEEE International Conference on Integrated Circuits, Technologies and Applications, 2018, pp. 47-48, XP033545411.

Elinor Kashani et al., Digital closed loop design for wideband envelope tracking system, 2014 IEEE 28-th Convention of Electrical and Electronics Engineers in Israel, 2014, pp. 1-5, XP032719135.

\* cited by examiner

ENVELOPE TRACKING SUPPLY MODULATOR WITH ZERO PEAKING AND ASSOCIATED ENVELOPE TRACKING CALIBRATION METHOD AND SYSTEM

CROSS REFERENCE TO RELATED APPLICATIONS

This application claims the benefit of U.S. provisional application No. 62/846,802, filed on May 13, 2019 and incorporated herein by reference.

BACKGROUND

The present invention relates to envelope tracking, and more particularly, to an envelope tracking supply modulator with zero peaking and associated envelope tracking calibration method and system.

A power amplifier (PA) is used to amplify a radio-frequency (RF) signal for radio transmission. The PA is commonly found in a wireless communication device for driving antenna(s) of a transmitter. The power consumption of a PA is critical to a wireless communication device that is battery operated. Traditionally, the PA is biased with a fixed supply voltage. Peak RF output power conditions generally occur when the RF input signal input to the PA is at a maximum level. However, when the PA is backed-off from the peak RF output power conditions, the excess input power must be dissipated by the PA because it is not being transformed into useful RF output power. That is, the traditional fixed PA supply voltage results in significant amount of power loss as heat. Envelope tracking is a technique that requires the supply voltage of the PA to be modulated dynamically with the envelope of the RF input signal. This would make the PA operate closer to the peak level at all times and dramatically improve the efficiency of the PA. That is, envelope tracking technique modulates the PA supply voltage to track the envelope of the RF input signal to reduce the amount of power dissipated as heat.

In wireless communications, bandwidth is the frequency range occupied by a modulated carrier signal. With the advance of wireless communication technology, a wider bandwidth is used by one modulated carrier signal. Hence, a wide bandwidth linear amplifier is needed by an envelope tracking supply modulator that is used to supply a modulated supply voltage to the PA. Typically, the transconductance (bias current) of a linear amplifier is increased to enhance bandwidth and linearity. Since a large bias current is needed by the linear amplifier for pushing the dominant pole to a higher frequency, a typical wide-bandwidth envelope tracking design is power-hungry. Furthermore, considering a case where the envelope tracking supply modulator is fabricated using a mature process (e.g., 18 nm process), the quiescent current of the linear amplifier increases dramatically for a wide envelope tracking bandwidth.

Thus, there is a need for an innovative design which achieves wide-bandwidth envelope tracking without additional quiescent current consumption.

SUMMARY

One of the objectives of the claimed invention is to provide an envelope tracking supply modulator with zero peaking and associated envelope tracking calibration method and system.

According to a first aspect of the present invention, an exemplary envelope tracking supply modulator is disclosed. The exemplary envelope tracking supply modulator includes an amplifier circuit and a zero peaking circuit. The amplifier circuit is arranged to receive an envelope input, generate a modulated supply voltage according to the envelope input, and provide the modulated supply voltage to a power amplifier. The zero peaking circuit is coupled to the amplifier circuit and arranged to apply zero peaking to the amplifier circuit, where said zero peaking inserts a zero at a frequency.

According to a second aspect of the present invention, an exemplary wireless communication system is disclosed. The exemplary wireless communication system includes a transmit (TX) circuit, an envelope tracking circuit, a receive (RX) circuit, and an envelope tracking calibration circuit. The TX circuit is arranged to receive a TX baseband signal, generate a radio-frequency (RF) signal according to the TX baseband signal, and output the RF signal via a power amplifier (PA). The envelope tracking circuit is arranged to derive an envelope input from the TX baseband signal, and generate a modulated supply voltage according to the envelope input. The envelope tracking circuit comprises an envelope tracking supply modulator. The envelope tracking supply modulator comprises an amplifier circuit and an adjustable zero peaking circuit. The amplifier circuit is arranged to receive the envelope input, generate the modulated supply voltage according to the envelope input, and provide the modulated supply voltage to the PA. The adjustable zero peaking circuit is coupled to the amplifier circuit and arranged to apply zero peaking to the amplifier circuit, where said zero peaking inserts a zero at a frequency. The RX circuit is arranged to receive an output of the PA, and derive an RX baseband signal from the output of the PA. The envelope tracking calibration circuit is arranged to calibrate the adjustable zero peaking circuit by analyzing the RX baseband signal.

According to a third aspect of the present invention, an exemplary envelope tracking calibration method is disclosed. The exemplary envelope tracking calibration method includes: receiving a transmit (TX) baseband signal, generating a radio-frequency (RF) signal according to the TX baseband signal, and outputting the RF signal via a power amplifier (PA); deriving an envelope input from the TX baseband signal; generating, by an amplifier circuit, a modulated supply voltage according to the envelope input; providing the modulated supply voltage to the PA; applying zero peaking to the amplifier circuit, where said zero peaking inserts a zero at a frequency; receiving an output of the PA, and deriving a receive (RX) baseband signal from the output of the PA; and calibrating said zero peaking by analyzing the RX baseband signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
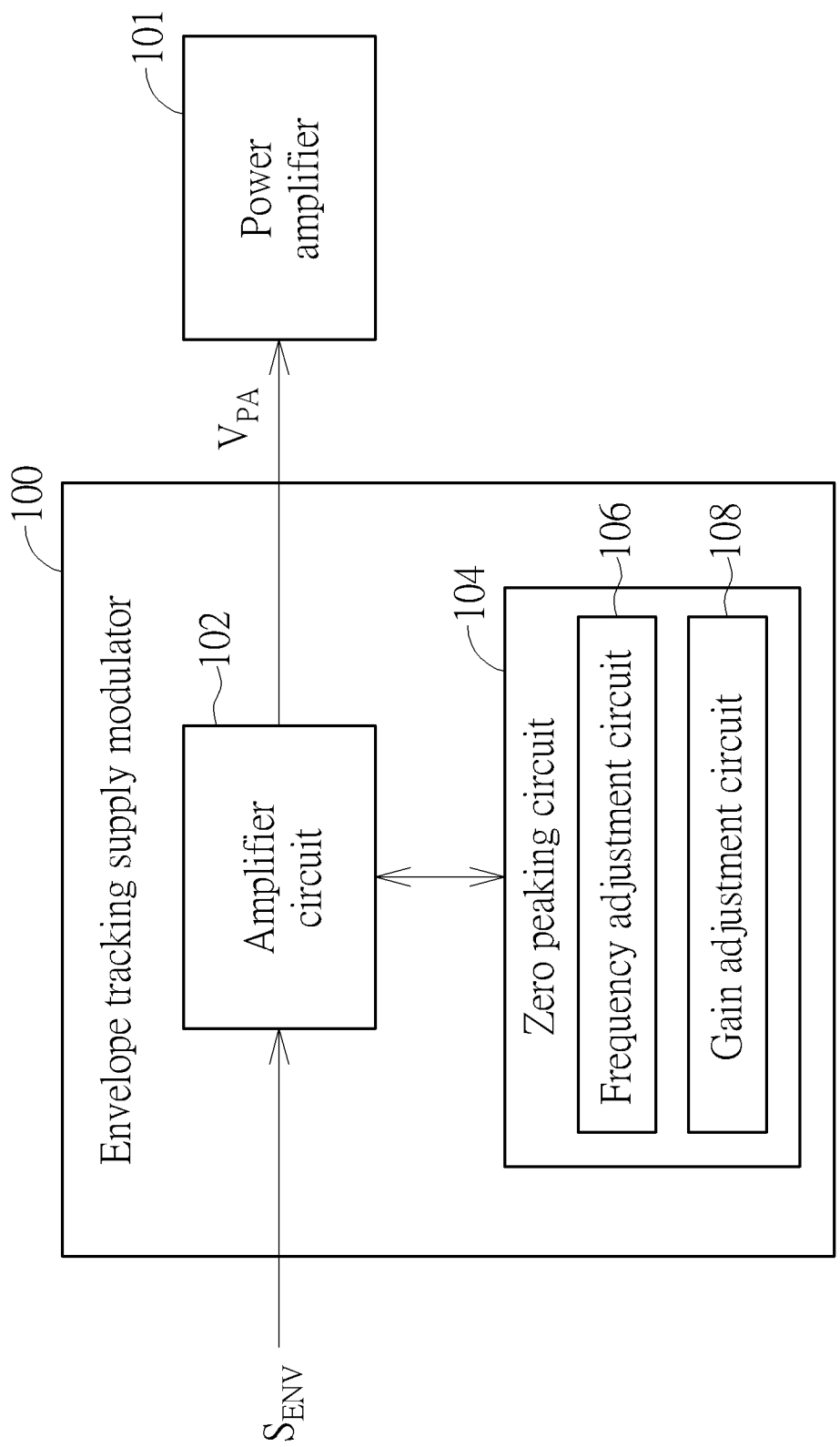
FIG. 1 is a block diagram illustrating an envelope tracking supply modulator according to an embodiment of the present invention.

FIG. 1 is a block diagram illustrating an envelope tracking supply modulator according to an embodiment of the present invention. The envelope tracking supply modulator 100 includes an amplifier circuit 102 and a zero peaking circuit 104. The amplifier circuit 102 is arranged to receive an envelope input $S_{ENV}$, generate a modulated supply voltage $V_{PA}$ according to the envelope input $S_{ENV}$, and provide the modulated supply voltage $V_{PA}$ to a power amplifier 101. The zero peaking circuit 104 is coupled to the amplifier circuit 102, and arranged to apply zero peaking to the amplifier circuit 102, where the zero peaking inserts an additional zero at a selected frequency to thereby push a dominant pole to a higher frequency. For example, the amplifier circuit 102 without zero peaking has an original dominant pole frequency. The amplifier circuit 102 with zero peaking may have the zero peaking frequency located at or around the original dominant pole frequency to compensate for amplifier gain loss at the original dominant pole frequency. In this way, the bandwidth of the envelope tracking can be increased without additional current consumption. For example, 3 dB frequency can be higher than 100 MHz.

In this embodiment, the zero peaking circuit 104 is adjustable, and includes a frequency adjustment circuit 106 and a gain adjustment circuit 108. The frequency adjustment circuit 106 is arranged to adjust the frequency of the additional zero inserted by zero peaking. Hence, the zero peaking frequency can be shifted from one frequency value to another frequency value, depending upon the actual design considerations. The gain adjustment circuit 108 is arranged to adjust a gain introduced by the additional zero inserted by the zero peaking. Hence, the zero peaking gain can be changed from one gain value to another gain value, depending upon the actual design considerations.

It should be noted that the envelope tracking supply modulator 100 shown in FIG. 1 is for illustrative purposes only, and is not meant to be a limitation of the present invention. For example, the zero peaking circuit 104 may be modified to omit the gain adjustment circuit 108. For another example, the zero peaking circuit 104 may be modified to omit the frequency adjustment circuit 106. For yet another example, the zero peaking circuit 104 may be modified to have a fixed zero peaking setting. That is, any envelope tracking supply modulator with zero peaking falls within the scope of the present invention.

Figure 2:
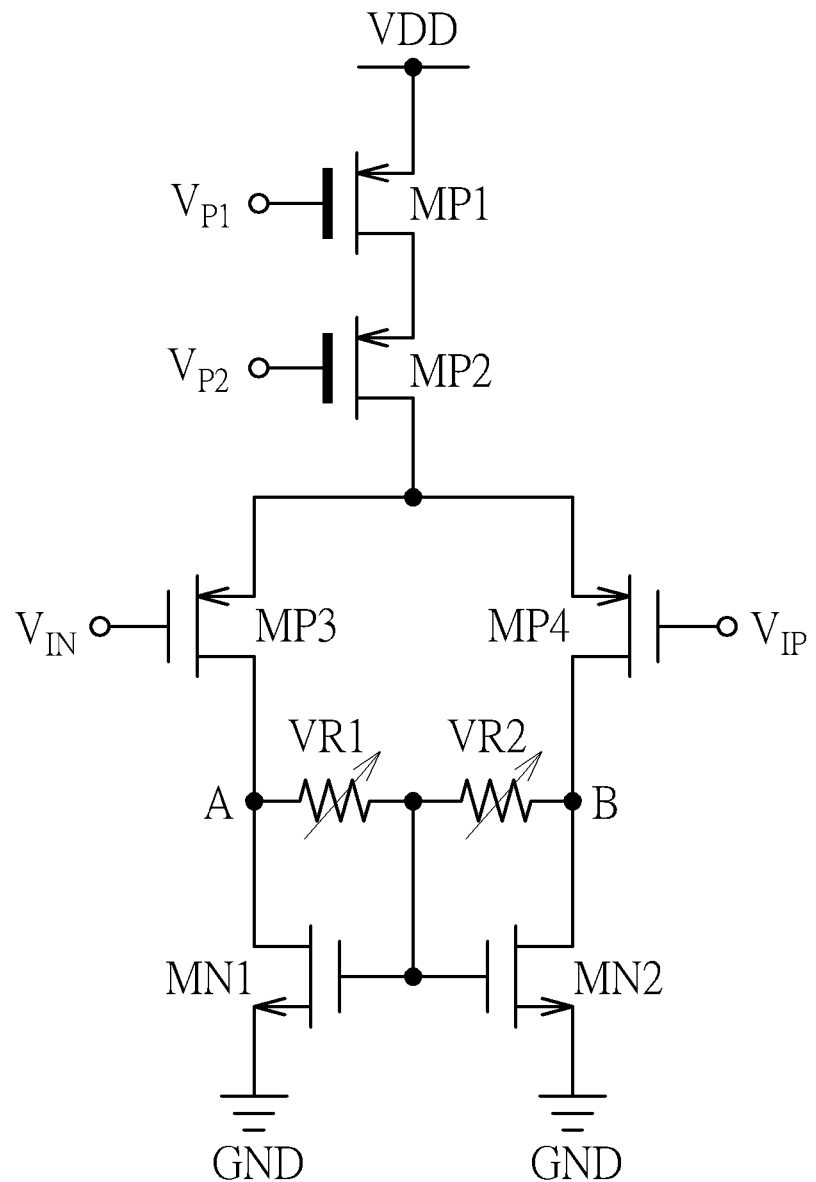
FIG. 2 is a circuit diagram illustrating a part of an envelope tracking supply modulator with zero peaking according to an embodiment of the present invention.

In one exemplary design, the amplifier circuit 102 may be implemented using a multi-stage amplifier, and the zero peaking circuit 104 may provide zero peaking adjustment at an input stage (i.e., first stage) of the multi-stage amplifier. FIG. 2 is a circuit diagram illustrating a part of an envelope tracking supply modulator with zero peaking according to an embodiment of the present invention. An input stage of the amplifier circuit 102 (which is a multi-stage amplifier) includes a plurality of P-type metal oxide semiconductor (PMOS) transistors MP1, MP2, MP3, and MP4 and a plurality of N-type metal oxide semiconductor (NMOS) transistors MN1 and MN2. A source terminal of the PMOS transistor MP1 is coupled to a supply voltage VDD. Source terminals of the NMOS transistors MN1 and MN2 are coupled to a ground voltage GND. The envelope input $S_{ENV}$ may be a differential input consisting of a positive signal $V_{IP}$ and a negative signal $V_{IN}$. The positive signal $V_{IP}$ is coupled to a gate terminal of the PMOS transistor MP4. The negative signal $V_{IN}$ is coupled to a gate terminal of the PMOS transistor MP3. In this embodiment, the zero peaking adjustment is achieved by two variable resistors VR1 and VR2. With proper setting of the variable resistors VR1 and VR2, the zero peaking frequency can be shifted for pushing the dominant pole at node A/B to a higher frequency.

Considering a case where the zero peaking circuit 104 is adjustable, it may be automatically calibrated to achieve an optimized zero peaking setting. The present invention further proposes an envelope tracking supply modulator that can be calibrated by using a continuous-time adaptive gain equalization technique.

Figure 3:
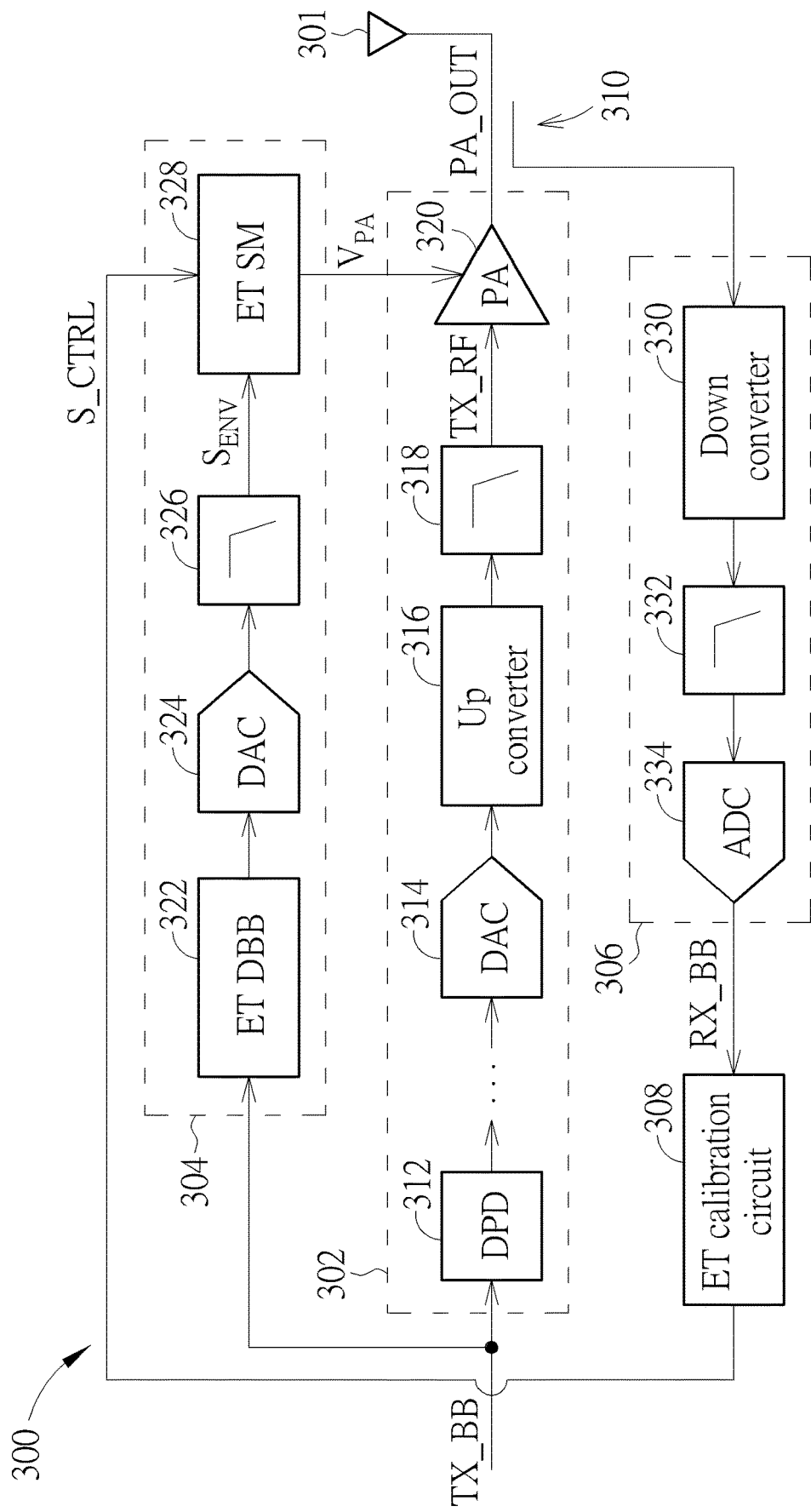
FIG. 3 is a block diagram of a wireless communication system according to an embodiment of the present invention.

FIG. 3 is a block diagram of a wireless communication system according to an embodiment of the present invention. The wireless communication system 300 includes a transmit (TX) circuit 302, an envelope tracking circuit 304, a receive (RX) circuit 306, and an envelope tracking (ET) calibration circuit 308. The TX circuit 302 is arranged to receive a TX baseband signal TX_BB, generate a radio-frequency (RF) signal TX_RF according to the TX baseband signal TX_BB, and output the RF signal TX_RF to an antenna 301 via a power amplifier (PA) 320. For example, the TX baseband signal TX_BB is a digital signal, the RF signal TX_RF is an analog signal, and the TX circuit 302 includes a digital pre-distortion circuit (denoted by "DPD") 312, a digital-to-analog converter (DAC) 314, an upconverter 316, an analog filter 318, and the PA 320.

The envelope tracking circuit 304 is arranged to derive an envelope input $S_{ENV}$ from the baseband signal TX_BB, and generate a modulated supply voltage $V_{PA}$ according to the envelope input $S_{ENV}$. For example, the TX baseband signal TX_BB is a digital signal, the envelope input $S_{ENV}$ is an analog signal, and the envelope tracking circuit 304 includes an envelope tracking digital baseband circuit (denoted by "ET DBB") 322, a DAC 324, an analog filter 326, and an envelope tracking supply modulator (ETSM) 328. The envelope tracking digital baseband circuit 322 may include a timing alignment block, an envelope detection block, a lookup table, etc. Accurate time alignment between the PA supply voltage (i.e., $V_{PA}$) and the PA input signal (i.e., TX_RF) is critical. The timing alignment block of the envelope tracking digital baseband circuit 322 may include a delay circuit used to time align the envelope tracking supply modulator output with the RF input at the PA 320. The envelope detection block of the envelope tracking digital baseband circuit 322 may perform envelope magnitude calculation. For example, the amplitude $V_{IN}$ of the envelope is computed as the unsigned polar magnitude of an in-phase signal and a quadrature signal. A suitable shaping function is required to bias the PA 320 within a valid operating range and to improve linearization characteristics.

The lookup table of the envelope tracking digital baseband circuit 322 may provide envelope shaping which determines relationship between the envelope magnitude (i.e., $V_{IN}$) and the PA supply voltage (i.e., $V_{PA}$).

As mentioned above, the envelope tracking supply modulator 328 may be implemented by the envelope tracking supply modulator 100 shown in FIG. 1, such that the envelope tracking supply modulator 328 is adjustable and can be automatically calibrated to achieve an optimized zero peaking setting. When the wireless communication system 300 is operated under a calibration mode, The TX baseband signal TX_BB is configured to have a predetermined envelope pattern, and the RX circuit 306 is arranged to receive an output PA_OUT of the PA 320 via a coupler 310, and derive an RX baseband signal RX_BB from the output PA_OUT of the PA 320. For example, the RX circuit 306 includes a downconverter 330, an analog filter 332, and an analog-to-digital converter (ADC) 334.

When the wireless communication system 300 is operated under the calibration mode, the envelope tracking calibration circuit 308 is a digital circuit arranged to calibrate an adjustable zero peaking circuit (e.g., zero peaking circuit 104) included in the envelope tracking supply modulator 328 by analyzing the RX baseband signal RX_BB. In this embodiment, the envelope tracking supply modulator 328 may be implemented by the envelope tracking supply modulator 100 shown in FIG. 1. Hence, the envelope tracking calibration circuit 308 generates a control signal S_CTRL to the envelope tracking supply modulator 328 to control one or both of the frequency adjustment circuit 106 and the gain adjustment circuit 108. For example, the envelope tracking calibration circuit 308 calculates an adjacent channel leakage ratio (ACLR) according to the RX baseband signal RX_BB, and adaptively calibrates the adjustable zero peaking circuit 104 according to the ACLR. In accordance with the proposed continuous-time adaptive gain equalization technique, an optimized zero peaking setting can be achieved by finding the best ACLR for an envelope tracking bandwidth that is larger than 100 MHz.

Figure 4:
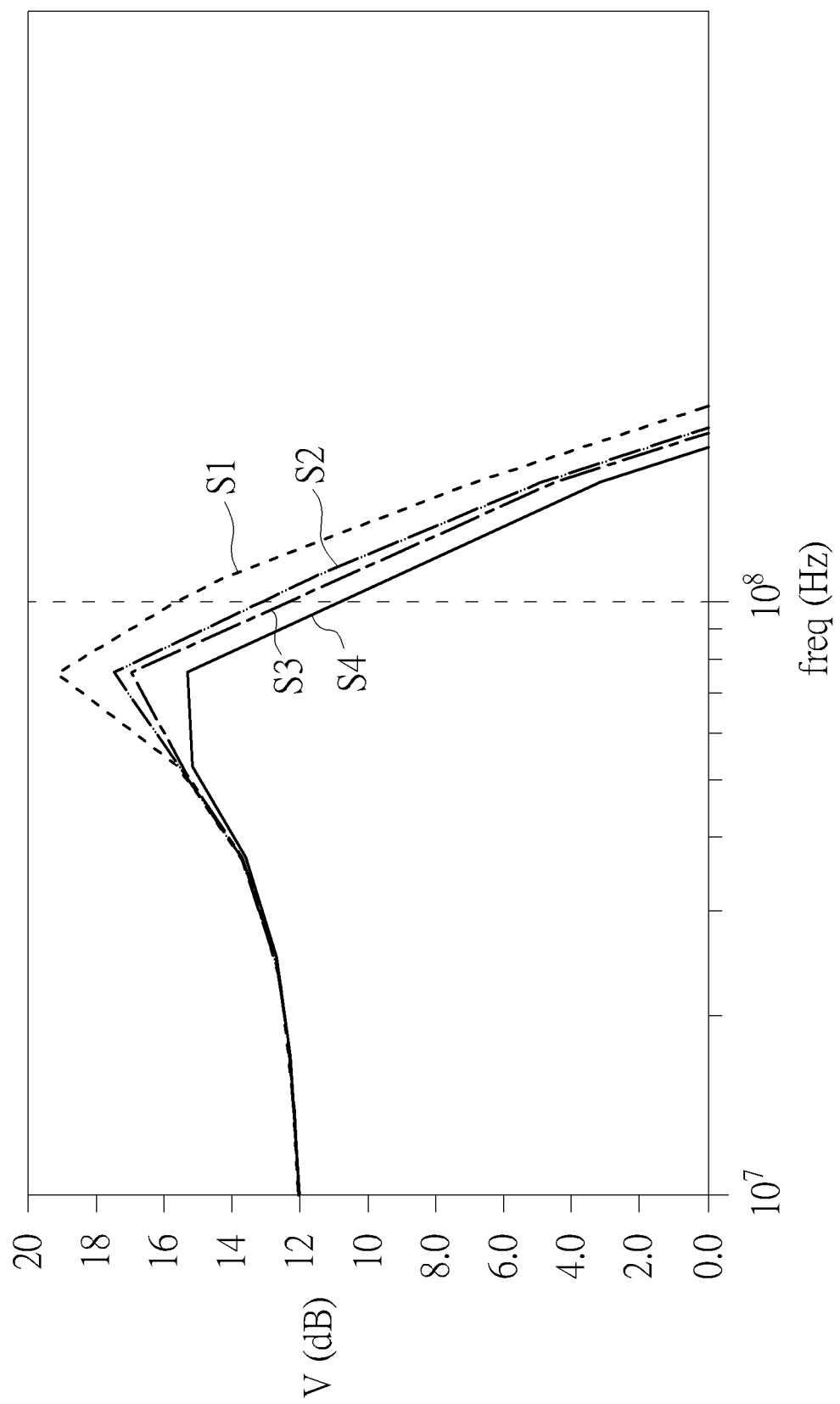
FIG. 4 is a diagram illustrating a frequency response of an envelope tracking supply modulator under different zero peaking settings according to an embodiment of the present invention.

The frequency adjustment circuit 106 and the gain adjustment circuit 108 of the adjustable zero peaking circuit 104 may be configured for allowing the adjustable zero peaking circuit 104 to support a plurality of pre-defined zero peaking settings, where each of the pre-defined zero peaking settings is defined by a zero peaking frequency and a zero peaking gain. In a case where the envelope tracking supply modulator 328 is implemented by the envelope tracking supply modulator 100, the envelope tracking calibration circuit 308 may refer to a quality metric (e.g., ACLR) to select one of the pre-defined zero peaking settings as a target zero peaking setting for the adjustable zero peaking circuit 104. FIG. 4 is a diagram illustrating a frequency response of an envelope tracking supply modulator under different zero peaking settings according to an embodiment of the present invention. Suppose that the adjustable zero peaking circuit 104 supports four pre-defined zero peaking settings S1, S2, S3, and S4 that provide different high-frequency gain compensation. As shown in FIG. 4, when the pre-defined zero peaking setting S1 is selected, the high-frequency gain at 100 MHz is 15.81 dB; when the pre-defined zero peaking setting S2 is selected, the high-frequency gain at 100 MHz is 13.4 dB; when the pre-defined zero peaking setting S3 is selected, the high-frequency gain at 100 MHz is 12.89 dB; and when the pre-defined zero peaking setting S4 is selected, the high-frequency gain at 100 MHz is 11.21 dB. By way of example, but not limitation, the envelope tracking calibration circuit 308 may select the best zero peaking setting from the pre-defined zero peaking settings by performing binary search on the basis of the calculated ACLR, where the best zero peaking setting is associated with the best ACLR for envelope tracking bandwidth that is not smaller than 100 MHz.

In some embodiments of the present invention, the envelope tracking supply modulator 100/328 may be a part of a power management integrated circuit (PMIC), and the power amplifier 101/320 may be an external amplifier that is driven by the PMIC. Hence, an AC channel between the PMIC and the power amplifier 101/320 may be routed on a printed circuit board (PCB). The parasitic elements of the AC channel (which is used to deliver the PA supply voltage) may introduce peaking within the desired bandwidth (e.g., 100 MHz or 200 MHz). The AC channel on the PCB may be properly designed to ensure that magnitude of the peaking induced by parasitic RLC is constrained within an acceptable level or the peaking induced by parasitic RLC is pushed to a higher frequency outside the desired bandwidth (e.g., 100 MHz or 200 Mhz).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communication system comprising:
   a transmit (TX) circuit, arranged to receive a TX baseband signal, generate a radio-frequency (RF) signal according to the TX baseband signal, and output the RF signal via a power amplifier (PA);
   an envelope tracking circuit, arranged to derive an envelope input from the TX baseband signal, and generate a modulated supply voltage according to the envelope input, wherein the envelope tracking circuit comprises an envelope tracking supply modulator, and the envelope tracking supply modulator comprises:
      an amplifier circuit, arranged to receive the envelope input, generate the modulated supply voltage according to the envelope input, and provide the modulated supply voltage to the PA; and
      an adjustable zero peaking circuit, coupled to the amplifier circuit and arranged to apply zero peaking to the amplifier circuit, where said zero peaking inserts a zero at a frequency;
   a receive (RX) circuit, arranged to receive an output of the PA, and derive an RX baseband signal from the output of the PA; and
   an envelope tracking calibration circuit, arranged to calibrate the adjustable zero peaking circuit by analyzing the RX baseband signal.

2. The wireless communication system of claim 1, wherein the adjustable zero peaking circuit comprises:
   a frequency adjustment circuit, arranged to adjust the frequency of the zero inserted by said zero peaking, wherein the frequency adjustment circuit operates under control of the envelope tracking calibration circuit.

3. The wireless communication system of claim 1, wherein the adjustable zero peaking circuit comprises:
   a gain adjustment circuit, arranged to adjust a gain introduced by the zero inserted by said zero peaking, wherein the gain adjustment circuit operates under control of the envelope tracking calibration circuit.

4. The wireless communication system of claim 1, wherein the envelope tracking calibration circuit is arranged to calculate an adjacent channel leakage ratio (ACLR) according to the RX baseband signal, and adaptively calibrate the adjustable zero peaking circuit according to the ACLR.

5. The wireless communication system of claim 4, wherein the adjustable zero peaking circuit is arranged to support a plurality of pre-defined zero peaking settings, and the envelope tracking calibration circuit refers to the ACLR to select one of the pre-defined zero peaking settings as a target zero peaking setting for the adjustable zero peaking circuit.

6. An envelope tracking calibration method comprising:
receiving a transmit (TX) baseband signal, generating a radio-frequency (RF) signal according to the TX baseband signal, and outputting the RF signal via a power amplifier (PA);
deriving an envelope input from the TX baseband signal;
generating, by an amplifier circuit, a modulated supply voltage according to the envelope input;
providing the modulated supply voltage to the PA;
applying zero peaking to the amplifier circuit, where said zero peaking inserts a zero at a frequency;
receiving an output of the PA, and deriving a receive (RX) baseband signal from the output of the PA; and
calibrating said zero peaking by analyzing the RX baseband signal.

7. The envelope tracking calibration method of claim 6, wherein calibrating said zero peaking comprises:
adjusting the frequency of the zero inserted by said zero peaking.

8. The envelope tracking calibration method of claim 6, wherein calibrating said zero peaking comprises:
adjusting a gain introduced by the zero inserted by said zero peaking.

9. The envelope tracking calibration method of claim 6, wherein calibrating said zero peaking by analyzing the RX baseband signal comprises:
calculating an adjacent channel leakage ratio (ACLR) according to the RX baseband signal; and
adaptively calibrating said zero peaking according to the ACLR.

10. The envelope tracking calibration method of claim 9, wherein adaptively calibrating said zero peaking according to the ACLR comprises:
referring to the ACLR to select one of a plurality of pre-defined zero peaking settings as a target zero peaking setting for said zero peaking.

11. An envelope tracking supply modulator comprising:
an amplifier circuit, arranged to receive an envelope input, generate a modulated supply voltage according to the envelope input, and provide the modulated supply voltage to a power amplifier;
an adjustable zero peaking circuit, coupled to the amplifier circuit and arranged to apply zero peaking to the amplifier circuit, where said zero peaking inserts a zero at a frequency to increase a bandwidth of the amplifier circuit; and
a calibration circuit arranged to calibrate the adjustable zero peaking circuit.

12. The envelope tracking supply modulator of claim 11, wherein the adjustable zero peaking circuit comprises:
a frequency adjustment circuit, arranged to adjust the frequency of the zero inserted by said zero peaking.

13. The envelope tracking supply modulator of claim 11, wherein the adjustable zero peaking circuit comprises:
a gain adjustment circuit, arranged to adjust a gain introduced by the zero inserted by said zero peaking.

14. The envelope tracking supply modulator of claim 11, wherein the calibration circuit is configured to calibrate the adjustable zero peaking circuit by analyzing a received baseband signal.

* * * * *